United States Patent
Bhanji et al.

(10) Patent No.: US 7,788,617 B2
(45) Date of Patent: Aug. 31, 2010

(54) METHOD OF MODELING AND EMPLOYING THE CMOS GATE SLEW AND OUTPUT LOAD DEPENDENT PIN CAPACITANCE DURING TIMING ANALYSIS

(75) Inventors: Adil Bhanji, Wappingers Falls, NY (US); Soroush Abbaspour, Fishkill, NY (US); Peter Feldmann, New York, NY (US); Debjit Sinha, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 350 days.

(21) Appl. No.: 12/043,455

(22) Filed: Mar. 6, 2008

(65) Prior Publication Data
US 2009/0228850 A1 Sep. 10, 2009

(51) Int. Cl.
*G06F 17/50* (2006.01)

(52) U.S. Cl. .................. 716/6; 716/1; 716/2; 716/3; 716/4; 716/5; 703/13; 703/14

(58) Field of Classification Search .............. 716/1–6; 703/13, 14
See application file for complete search history.

(56) References Cited

U.S. PATENT DOCUMENTS

| | | | | |
|---|---|---|---|---|
| 6,397,170 | B1 * | 5/2002 | Dean et al. ............ | 703/14 |
| 7,010,763 | B2 * | 3/2006 | Hathaway et al. .......... | 716/2 |
| 7,013,438 | B1 * | 3/2006 | Saldanha et al. ........... | 716/2 |
| 7,325,210 | B2 * | 1/2008 | Rao et al. ............... | 716/6 |
| 7,552,412 | B2 * | 6/2009 | Abbaspour et al. ......... | 716/6 |
| 7,594,209 | B2 * | 9/2009 | Abbaspour et al. ......... | 716/5 |
| 2008/0172642 | A1 * | 7/2008 | Abbaspour et al. ......... | 716/6 |
| 2009/0132982 | A1 * | 5/2009 | Kotecha et al. ........... | 716/6 |
| 2009/0193373 | A1 * | 7/2009 | Abbaspour et al. ......... | 716/6 |
| 2009/0228851 | A1 * | 9/2009 | Abbaspour et al. ......... | 716/6 |

OTHER PUBLICATIONS

Turgis et al.; "A novel macromodel for power estimation in CMOS structures"; Publication Year: 1998; Computer-Aided Design of Integrated Circuits and Systems, IEEE Transactions on; vol. 17, Issue: 11; pp. 1090-1098.*

(Continued)

*Primary Examiner*—Helen Rossoshek
(74) *Attorney, Agent, or Firm*—H. Daniel Schnurmann

(57) ABSTRACT

An accurate method to compute the capacitance at a pin whose capacitance is slew dependant. The method uses existing library characterized data and provides an equation based approach which can easily be integrated in static timing analysis without the added resource needs that an iterative approach would require. An RC/RLC network from slew and output load dependent pin capacitance tables is generated. The resulting linear network which models the pin capacitance is then stitched to the original interconnect network and used to calculate the propagation delay across a gate and corresponding interconnect. The method steps include: a) determining a response of the gate pin capacitance to its input slew and output load; b) synthesizing a linear time-invariant filter that matches the response; c) extending the interconnect model to include the synthesized time-invariant filter; and d) inputting the extended interconnect model into a static timing analysis for determining timing behavior between a gate input and each of its fan-out gates.

14 Claims, 3 Drawing Sheets

OTHER PUBLICATIONS

Ki-Wook et al.; "Logic transformation for low power synthesis"; Publication Year: 1999; Design, Automation and Test in Europe Conference and Exhibition 1999. Proceedings; pp. 158-162.*

Ravindra et al.; "A Statistical Model for Estimating the Effect of Process Variations on Delay and Slew Metrics for VLSI Interconnects"; Publication Year: 2007; Digital System Design Architectures, Methods and Tools, 2007. DSD 2007. 10th Euromicro Conference on; pp. 325-333.*

Abbaspour et al.; "VGTA: variation-aware gate timing analysis"; Publication Year: 2005; Computer Design: VLSI in Computers and Processors, 2005. ICCD 2005. Proceedings. 2005 IEEE International Conference on ; pp. 351-356.*

Shih et at al.; "Fast MOS circuit simulation with a direct equation solver"; Publication Year: 1989; Computer Design: VLSI in Computers and Processors, 1989. ICCD '89. Proceedings., 1989 IEEE International Conference on ; pp. 276-279.*

\* cited by examiner

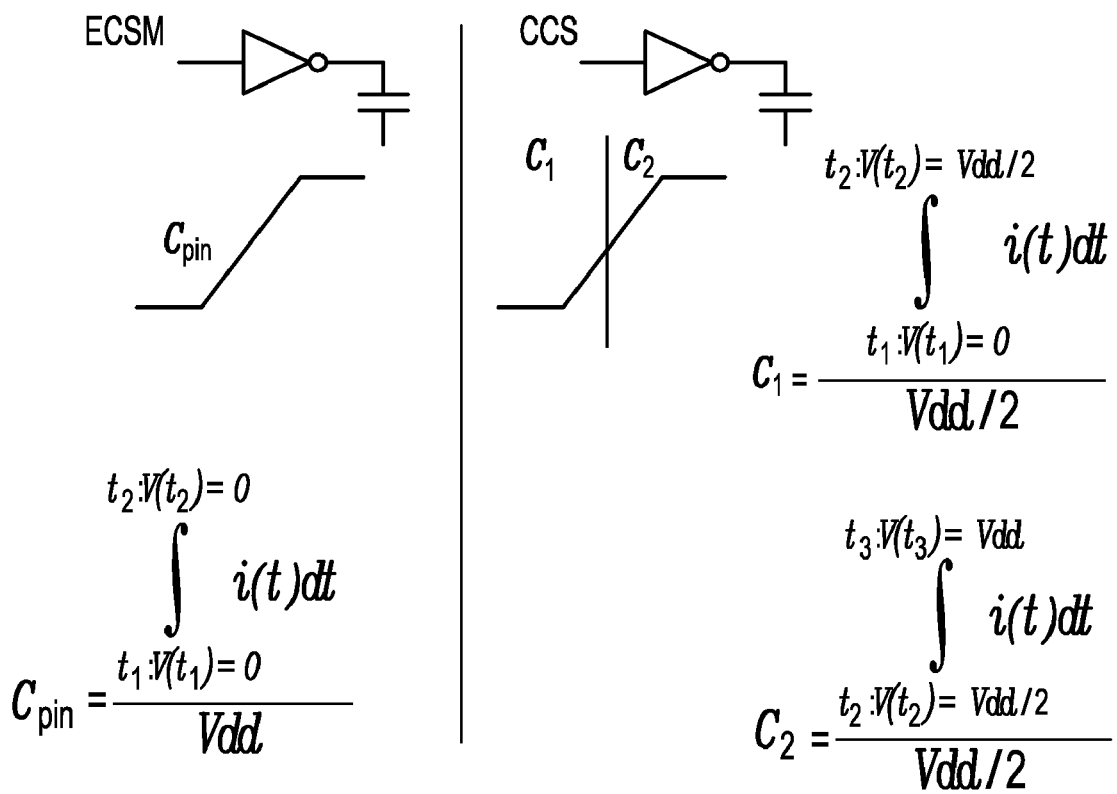
FIG. 2
(PRIOR ART)
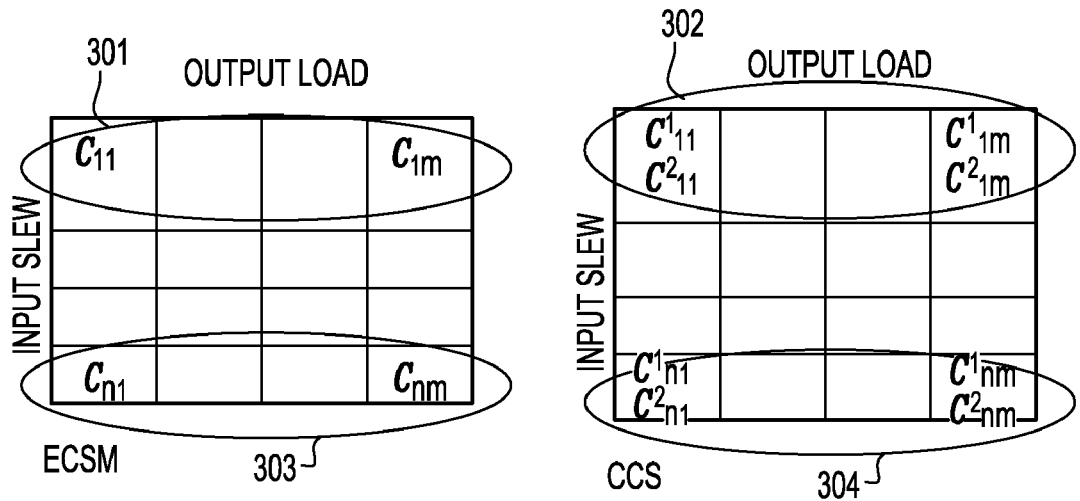
FIG. 3a
(PRIOR ART)
FIG. 3b
(PRIOR ART)

US 7,788,617 B2

METHOD OF MODELING AND EMPLOYING THE CMOS GATE SLEW AND OUTPUT LOAD DEPENDENT PIN CAPACITANCE DURING TIMING ANALYSIS

FIELD OF THE INVENTION

This invention generally relates to the field of Design Automation of Very Large Scale Integration (VLSI) circuits, and more particularly, to the modeling and analysis of slew and load dependent input pin capacitances of metal oxide semiconductor (MOS) gates.

BACKGROUND OF THE INVENTION

Static timing analysis (STA) is a key step in the design of high speed very large scale integrated (VLSI) circuits. STA is used to verify that a VLSI chip performs correctly at the required frequency before it is released to manufacturing. STA typically consists of the following main steps: 1) Delay calculation, which involves modeling and calculating path delays for the gates and interconnects contained in the design, 2) Propagation of arrival, required arrival times and slews, and 3) Slack calculation for the paths in the design.

Referring to FIG. 1a, there is shown a conventional overall delay from input pin A of the CMOS inverter 108 to the input pin C of the NAND2 gate 107. This delay is obtained by adding the gate delay from input pin A to the output pin B of CMOS inverter 108 and the interconnect propagation delay from output pin B of the inverter 108 to the input pin C of the NAND2 gate 107, as in EQ. 1. This overall delay is also defined as the stage delay 110, and represents the propagation delay between the voltage waveforms 109 and 104, for a given voltage threshold crossing point of the waveforms.

$$\text{Delay}_{AC} = \text{Delay}_{AB} + \text{Delay}_{BC} \qquad \text{EQ. 1}$$

The voltage waveform 109 at the sink of the interconnect network 105 is a function of the voltage waveform 103 at the input terminal of the interconnect network, the interconnect parasitics 105 and the input capacitance 106 of each gate 107 at the sink terminal(s) of the interconnect network. The interconnect delay and output slew are calculated by fitting a ramp or a piece-wise-linear waveform to the voltage waveform 103 at the input terminal of the interconnect network, and subsequently convolving it with the transfer function of the interconnect load. Various Model Order Reduction (MOR) techniques such as Asymptotic Waveform Evaluation (AWE) and Passive Reduced-order Interconnect Macromodeling Algorithm (PRIMA) have been proposed for accurate interconnect timing analysis. These techniques reduce the complexity of a large-scale interconnect network to a smaller one while preserving (to the possible extent) their input-output behavior. Alternatively, a large-scale interconnect network is approximated (reduced) to a smaller interconnect network so that when the same input signal is applied to both, the output response of the original and the approximated (reduced) network closely match each other. Higher order reduced models offer increased accuracy at the cost of increasing the complexity of the analysis. For instance, a first reduced order model can be analyzed very fast, but it may introduce significant errors in the input-output behavior of the system. Consequently, a trade-off between accuracy and speed for determining the order of the reduced model is performed.

The voltage waveform 103 at the output of the gate 108 is a function of different parameters that includes the voltage waveform 104 at the input terminal of the gate (which is propagated from the previous stages of the design), the interconnect parasitics 105, the input pin capacitance 106 of each gate 107 at the sink of the interconnect, and the characteristics of the primitive gate 108. Given the input voltage waveform 104, the gate timing library, the load parasitics 105, and the input pin capacitance 106 of each gate connected to the interconnect sink terminal(s), the gate timing analysis process calculates the gate output voltage waveform 103 and/or its characteristics with respect to the characteristics of the gate input voltage waveform 104 (e.g., the gate propagation delay and output slew).

Various gate modeling techniques have been employed for gate timing analysis. Three well-known techniques are based on: (1) using delay and slew polynomial equations which are characterized as a function of input slew and output capacitive load; (2) using delay and slew tables which are characterized as a function of the input slew and output capacitive load; and (3) using current source models where the output voltage/current is characterized as a function of input slew and output load, while the output voltage/current waveforms are tabulated. Each of these gate models are also characterized as a function of manufacturing process parameters (e.g. $L_{eff}$, doping concentration), and the environmental parameters (e.g., voltage, temperature).

The aforementioned models are all characterized as a function of input slew and output capacitive load. Given some slew at an input terminal of a gate and an approximated capacitive load at its output terminal, the gate propagation delay is obtained directly from the gate delay model. However, in very deep sub-micron (VDSM) technologies, the effect of interconnect resistive parasitics is significant and render approximating the interconnect load by a lumped capacitance susceptible to error. Using the sum of all the load capacitances as the capacitive load is a simple, albeit inaccurate approximation. A more accurate approximation for an $n^{th}$ order load seen by the gate (i.e., a load having n distributed capacitances to ground) is to use a reduced order model. As an example, for the case of resistive capacitive interconnects, the load can be approximated by a second order RC-π model. Equating the first, second, and third moments of the admittance of the real load with the first, second, and third moments, respectively of the RC-π load, the parameters $C_n$, $R_\pi$, and $C_f$ of the RC-π model, as shown in FIG. 1 (b) are obtained. The RC-π parameters are therefore functions of the input pin capacitance of each gate in the fan-out of the primitive gate. An "effective capacitance" technique is proposed, whereby the reduced order model load (e.g. the RC-π load) is approximated by an equivalent capacitance. The aforementioned models are then employed to obtain the gate delay and output slew, given the slew 115, at the input pin of the gate and the reduced order RC-π load 118.

Conventional Static Timing Analysis (STA) propagates signal timing information from the circuit primary inputs through gates and interconnects to calculate the earliest/latest signal arrival times/voltage waveforms at the circuit primary outputs. A typical conventional STA has a linear run-time complexity with respect to the number of the gates in the design. During the interconnect delay analysis, the input pin impedance of pins connected to the sink terminal(s) of the interconnect network are represented by fixed pin capacitance values.

The technology scaling to sub-90 nm geometry introduces new challenges that need to be addressed during timing analysis of VLSI circuits. Many model assumptions which have been made in 90+ nm nodes are no longer valid. Constant pin capacitance models no longer accurately describe the pin's loading contribution to the total load as seen by the source terminal of the interconnect network. Generally speaking, the gate input pin impedance may vary during the voltage transition at the input pin of the CMOS gate. In addition, its value is dependent on the loading condition at the output pin of that CMOS gate. Present industry standard gate current-source models offer two ways of modeling gate input pin capacitances: 1) the Effective Current Source Model (ECSM) format which models the input pin capacitance as a function of Slew and Output capacitive Load, and 2) the Composite Current Source (CCS) format that employs a two-piece pin capacitance model for each input slew/output capacitance combination. Both these models are table-based representations.

FIG. 2 shows the Slew and Output capacitive Load Dependent Pin Capacitances (referred hereinafter as SOLDPC) for ECSM and CCS. As shown in FIG. 2, the pin-capacitance definition in ECSM consists of a two-dimensional table. During characterization, a ramp input slew and output capacitive load is applied to the CMOS gate, and the effective input pin capacitance of the gate is calculated as the amount of charge that needs to be injected to the input pin of the driver divided by the supply voltage (Vdd) as follows:

$$C_{pin} = \frac{\int_{t_1 V(t_1)=0}^{t_2 V(t_2)=0} i(t)\,dt}{Vdd} \qquad \text{EQ. 2}$$

CCS uses a similar characterization method to calculate a two-piece input pin capacitance for every combination of the input slew and output load as follows:

$$C_1 = \frac{\int_{t_1 V(t_1)=0}^{t_2 V(t_2)=Vdd/2} i(t)\,dt}{Vdd/2}, \qquad \text{EQ. 3}$$

$$C_2 = \frac{\int_{t_2 V(t_2)=Vdd/2}^{t_3 V(t_3)=Vdd} i(t)\,dt}{Vdd/2}$$

$C_1$ represents the pin capacitance before the CMOS gate switches, while $C_2$ represents the pin capacitance after the gate switches. SOLDPC modeling may be generalized to an n-piece pin capacitance model for each slew/output load combination.

OBJECTS AND SUMMARY OF THE INVENTION

Accordingly, it is an object of the present invention to provide a method and a system for generating a filter from slew and output load dependent pin capacitances and stitching the resultant filter to the original interconnect network.

It is another object to provide a highly accurate model of slew and output load dependent pin capacitances applicable to VLSI circuits using a linear time-invariant filter (e.g., an RC/RLC network).

It is still another object to use the resultant stitched filter to calculate delays from the input terminal of a first gate, and the output of which is connected to an input of a second gate.

It is yet another object to obtain the computed pin capacitances without recurring to an iterative process.

These and other objects, aspects and advantages of the invention are achieved by a method of modeling and employing the CMOS gate's slew and output load dependent pin capacitance during timing analysis. The method preferably uses characterization tables or libraries, synthesizing a new model that is fully adaptable to any static timing analysis without resorting to the necessary computer resources required by an iterative approach.

In an embodiment of the present invention there is provided a method of modeling an input slew and output load dependent CMOS gate pin capacitance in a modeled plurality of gates and interconnects representing an integrated circuit, the method including the steps of: a) determining a response of the gate pin capacitance to its input slew and output load; b) synthesizing a linear time-invariant filter that matches the response; c) extending the interconnect model to include the synthesized time-invariant filter; and d) inputting the extended interconnect model into a static timing analysis for determining timing behavior between a gate input and each of its fan-out gates.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, where:

FIG. 2 is a diagram showing the representation of slew and output load dependent pin capacitances in current source modules represented in ECSM and CCS library formats.

FIGS. 3a and 3b are tables illustrating examples of library characterized slew and load dependent pin capacitance (SOLDPC) represented in ECSM and CCS library formats.

DETAILED DESCRIPTION

The present invention and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the present invention in detail.

Problem Statement

Figure 1A:
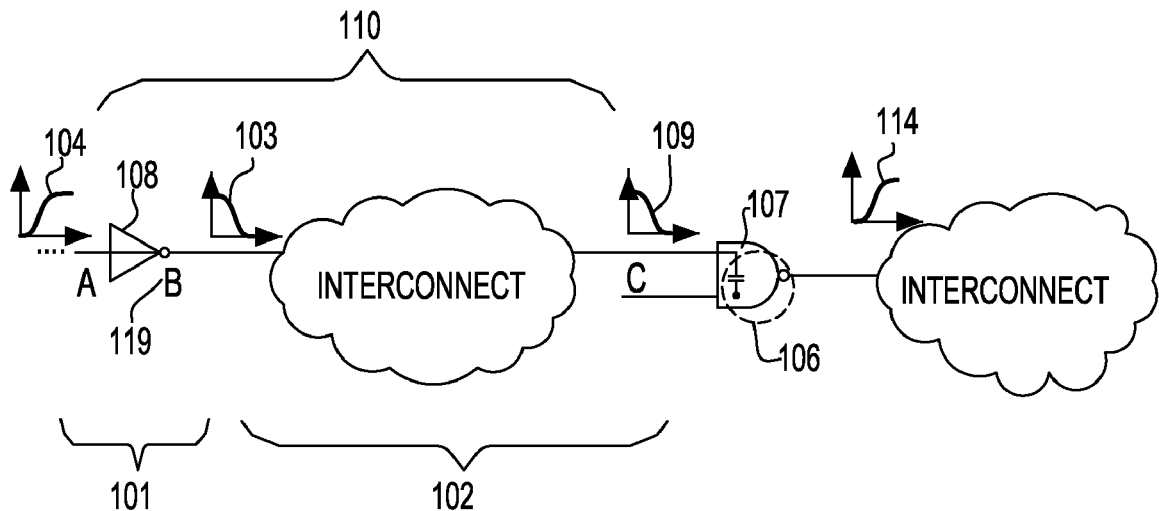
FIG. 1 is a diagram showing a prior art design that consists of two gates connected by an interconnect used to illustrate the problem solved by the present invention.
Figure 1B:
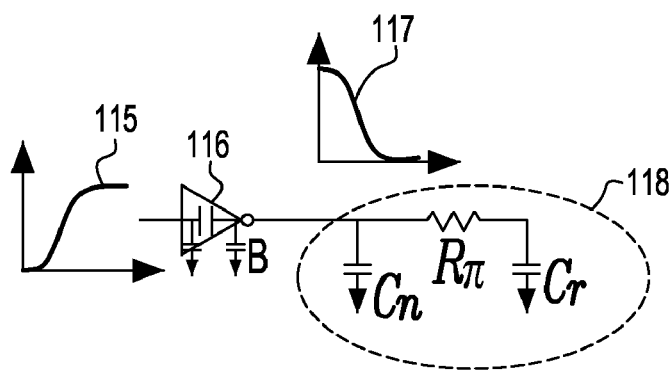

Referring back to prior art FIGS. 1a-1b, the delay 101 of a CMOS gate 108 depends on the loading at the output pin 119 of the CMOS gate. The gate input-pin capacitance 106 at each sink of the interconnect network connected to the pin 119 is required to obtain this loading. In the case of a constant pin capacitance, this capacitance is advantageously used to compute the effective loading of the net between 119 and 106. However, in the case of a slew and output load dependant pin capacitance, the input pin capacitance at pin 106 of the fan-out gate 107 requires the transition time of the signal 109 to reach it. The transition time computation requires the transition time 103 at pin 119. The transition time 103 further necessitates determining the load on the net between pins 119 and 106, which in turn, depends on the pin capacitance at pin 106, thus causing a circular dependency.

Conventional brute force approaches generally employ a methodology wherein an initial value of the input slew at the input pin of the interconnect is estimated and the analysis is performed iteratively until convergence to the capacitance is achieved. This approach is resource intensive both in the computer run-time and memory usage, and further, it greatly increases the STA run-time when designs have extremely large and numerous interconnects. Moreover, in addition to the run-times needed for the conventional approach, there are at least three additional limitations associated with the prior art standard approaches. 1) The industry standard pin capacitances are characterized as idealized ramp waveforms to the input pin of the CMOS gates. However, during timing analysis, the voltage waveform that actually arrives at the input pin of a gate does not match the characterized ramp waveform. This difference, between the idealized and actual waveform will introduce inaccuracy in the calculations specifically in cases where the actual waveform asymptotically approaches Vdd (a.k.a., long tail voltage waveform); 2) the size of the SOLDPC will particularly challenging, specially for variation-aware libraries in which the SOLDPC needs to be characterized as a function of the all different process-voltage-temperature (PVT) sources of variation; and 3) the slew and output load dependent pin capacitances cannot be easily used in today's industry gate and interconnect timing analysis tools, in particular, when SOLDPC necessitates special handling which can only complicate today's timing methodologies.

The present invention addresses all the above-mentioned problems by providing an efficient methodology that handles SOLDPC during timing and noise analysis flow. As will be described hereinafter, the steps of the inventive methodology represent the SOLDPC table as a compact, efficient, and easy-to-use linear time invariant filter.

Regarding the input pin capacitance, fast rising signals will view a certain capacitance, while slow rising signals are viewed as a different capacitance. This capacitance can be seen as the response of a linear system $$c(t) = \frac{i}{v}$$

or in the frequency domain $$C(\omega) = \frac{I}{j\omega V}$$

The "slew and output load dependent" effect is preferably simulated using a linear filter to model the pin capacitance, which can be explained as follows: a fast rising ramp has a spectrum containing more energy in the high frequencies compared with a slowly rising ramp. A filter can be designed to respond differently to the various frequency components of the input signal and using standard filter design techniques, a filter can be designed that implements the desired "slew and output load dependent" effect. Furthermore, standard filter synthesis techniques can be advantageously employed to construct the filter out of passive components, e.g., resistors, capacitors, and inductors.

Figure 4:
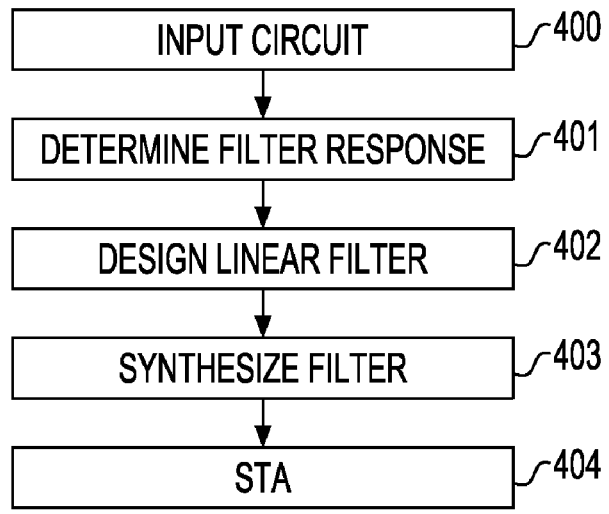
FIG. 4 shows is a flow chart illustrating the steps involved in timing circuits containing gates which have pins that have slew and load dependent pin capacitances.

Referring now to FIG. 4, the steps that are preferably used to describe the present invention are illustrated by way of timing circuits consisting of gates with pins having slew and load dependent pin capacitances.

In step 400, each gate whose pin capacitance behavior is slew and/or load dependent is processed to determine the desired filter response from the SOLDPC table. Next, in step 401, a linear filter to realize the desired response in step 400 is designed. Next, in step 402, the filter is synthesized in terms of a resistive/inductive/capacitive network. Next in step 403, the gate input model is replaced with the filter that was synthesized in step 402. Finally, in step 404, the revised model is now employed to perform the STA.

Figure 5A:
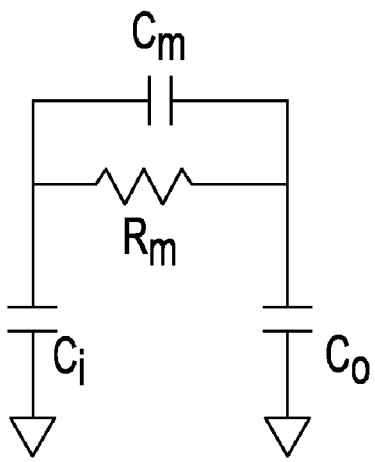
FIG. 5 illustrates a compact linear RC network being used as a replacement for SOLDPC.

For illustrative purposes, the compact linear RC network shown in FIG. 5 will be employed as a replacement for SOLDPC. The model to be used is characterized as having the following characteristics:

$C_i$ represents the effective input pin capacitance of the CMOS gate to ground.

$C_m$ represents the effective Miller capacitance $C_o$ represents the effective output pin capacitance of the gate to ground $R_m$ represents effective resistance of the driver seen from the input pin of the gate.

The following steps describe the technical basis for the representation of the SOLDPC as a compact linear network. Given a ramp voltage waveform with transition time, T, the charge injected to the proposed model from voltage level 0 to Vdd is represented by the following equation:

$$Q(T) = V_{dd}\left\{C_i + C_0 - \int_{t=0}^{t=T}\left[\frac{C_o^2}{T(C_o + C_m)} e^{\frac{-t}{R_m(C_m + C_o)}}\right]dt\right\} \quad \text{EQ. 4}$$

$$= V_{dd}\left\{C_i + C_0 - \frac{R_m C_o^2}{T}\left[1 - e^{\frac{-T}{R_m(C_m + C_o)}}\right]\right\}$$

If the same voltage waveform with transition time of T is applied to an effective pin capacitance with the value of $C_{pin}(T)$, the charge that feeds into this capacitance can be represented as:

$$Q_{pin}(T) = C_{pin}(T)V_{dd} \quad \text{EQ. 5}$$

Based on the definition of effective pin capacitance (c.f. Equations 2 and 3), the charges in EQ. 4 and EQ. 5 are equated, and the effective pin capacitance as a function of T is written as:

$$C_{pin}(T) = C_i + C_o - \frac{R_m C_o^2}{T}\left[1 - e^{\frac{-T}{R_m(C_m + C_o)}}\right] \quad \text{EQ. 6}$$

The above equation represents the effective pin capacitance as a function of slew, T, $C_i$, $C_m$, $R_m$, and $C_o$. Given a row of slew dependent pin-capacitance from a SOLDPC, $C_i$, $C_m$, $R_m$, and $C_o$ can be calculated, such that the above model will respond the same as the slew dependent pin capacitance.

Figure 5B:
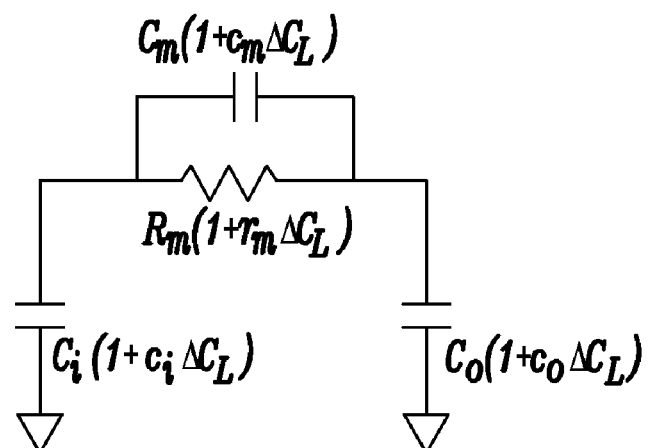

To model the dependency of the proposed model on the output load assumes a linear dependency of the R and C elements to the output load as shown in FIG. 5(b). The new model consists of $C_i$, $C_m$, $C_o$, $R_m$, and four linear coefficients, $c_i$, $c_m$, $c_o$, and $r_m$, respectively, which represent the sensitivity of $C_i$, $C_m$, $C_o$, and $R_m$ with respect to changes in output load. Note that the sensitivity of SOLDPC to output load is generally small. Since the sensitivity to output load is minimal, the use of linear sensitivity will not introduce significant accuracy issues. However, the proposed model is not restricted to linear sensitivity and one can use higher order sensitivities for more accuracy.

In order to synthesize the proposed model from the SOLDPC table, the following two techniques are preferably used:

Use curve fitting techniques for model synthesis. This is a very viable technique since it runs only during library characterization, and the cost of curve fitting does not affect the actual STA timing runs using the curve fitted data. Curve fitting techniques including least-square fitting (LSF) can be used to synthesize the parameters of the proposed model, (i.e., $C_i$, $C_m$, $C_o$, $R_m$, $c_i$, $c_m$, $c_o$, and $r_m$) from the SOLDPC data using the following problem formulation:

$$\min \sum_{\forall C_L} \sum_{\forall T} \left\{ \begin{array}{c} C_{pin}(T, C_L) - \\ \left\{ C_i^* + C_o^* - \dfrac{R_m^* C_o^{*2}}{T}\left[1 - e^{\frac{-T}{R_m^*(C_m^* + C_o^*)}}\right] \right\} \end{array} \right\}^2$$

where $C_i^* = C_i + c_i \Delta C_L$ $C_m^* = C_m + c_m \Delta C_L$ $C_o^* = C_o + c_o \Delta C_L$ $R_m^* = R_m + r_m \Delta C_L$ $\Delta C_L = C_L - k$ where k is a user-specified value.

Using an efficient look-up method which is fast and can be used dynamically during timing analysis.

Consider the following facts:

Based on EQ. 6, $$\lim_{T \to 0} C_{pin}(T) = C_i + \frac{C_m + C_o}{C_m + C_o}$$

In addition, $$\lim_{T \to \infty} C_{pin}(T) = C_i + C_o$$

Assuming $C_m \ll C_o$; the $$\lim_{T \to 0} C_{pin}(T) = C_i + \frac{C_m C_o}{C_m + C_o} \overset{\text{if } C_m \ll C_o}{=} C_i + C_m$$

If the above terms are substituted in Eq. 6, the following equations are obtained:

$$C_{pin}(T) = \lim_{T \to \infty} C_{pin}(T) - \frac{R_m C_o^2}{T}\left[1 - e^{R_m\left(\frac{-T}{\lim_{T \to 0} C_{pin}(T) - \lim_{T \to \infty} C_{pin}(T) + 2C_o}\right)}\right]$$

$C_m = \lim_{T \to 0} C_{pin}(T) - \lim_{T \to \infty} C_{pin}(T) + C_o$ $C_i = \lim_{T \to \infty} C_{pin}(T) - C_o$ For a fixed output load, two intermediate slew values, $T_1$, and $T_2$ are specified, and the corresponding pin capacitance values $C_i(T_1)$ and $C_{pin}(T_2)$ obtained by using the following equations, one can calculate the $C_i$, $C_m$, $C_o$, and $R_m$ values:

$$C_{pin}(T_1) - \lim_{T \to \infty} C_{pin}(T) = -\frac{R_m C_o^2}{T_1}\left[1 - e^{R_m\left(\frac{-T_1}{\lim_{T \to 0} C_{pin}(T) - \lim_{T \to \infty} C_{pin}(T) + 2C_o}\right)}\right]$$

$$C_{pin}(T_2) - \lim_{T \to \infty} C_{pin}(T) = -\frac{R_m C_o^2}{T_2}\left[1 - e^{R_m\left(\frac{-T}{\lim_{T \to 0} C_{pin}(T) - \lim_{T \to \infty} C_{pin}(T) + 2C_o}\right)}\right]$$

$C_m = \lim_{T \to 0} C_{pin}(T) - \lim_{T \to \infty} C_{pin}(T) + C_o$ $C_i = \lim_{T \to \infty} C_{pin}(T) - C_o$ To calculate the sensitivity of the model parameters to the output load, one can use two different rows of the FIG. 3 (preferably first row shown as 301 and last row shown as 303), and find the model parameters for each output load using the above procedure and employ finite differencing technique to calculate the sensitivities of the model parameters to output load (i.e., $C_i$, $C_m$, $c_o$, and $r_m$).

The interconnect network can be extended using the attached interconnect network and be used for gate delay and slew calculation (i.e. without using any iteration) as well as the interconnect delay and slew calculation.

The timing information in step 7 is preferably used to perform the static timing analysis.

Finally, the present invention can be realized in hardware, software, or a combination of hardware and software. The present invention can be realized in a centralized fashion in one computer system or in a distributed fashion where different elements are spread across several interconnected computer systems. Any kind of computer system—or other apparatus adapted for carrying out the methods described herein—is suitable. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out these methods.

Computer program means or computer program in the present context mean any expression, in any language, code or notation, of a set of instructions intended to cause a system having an information processing capability to perform a particular function either directly or after conversion to another language, code or notation and/or reproduction in a different material form.

While the present invention has been particularly described in conjunction with exemplary embodiments, it is evident that many alternatives, modifications and variations will be apparent to those skilled in the art in light of the present description. It is therefore contemplated that the appended claims will embrace any such alternatives, modifications and variations as falling within the true scope and spirit of the present invention.

What is claimed is:

1. A method of modeling an input slew and output load dependent CMOS gate pin capacitance in a modeled plurality of gates and interconnects representing an integrated circuit, the method comprising:
   using a computer:
   a) determining a response of the gate pin capacitance to its input slew and output load;
   b) synthesizing a linear time-invariant filter that matches the response;
   c) extending the interconnect model to include the synthesized time-invariant filter; and
   d) inputting said extended interconnect model into a static timing analysis for determining timing behavior between a gate input and each of its fan-out gates.

2. The method as recited in claim 1, wherein in step a) the response of the gate pin capacitance is obtained from predetermined slew and load dependent gate pin capacitance tables.

3. The method as recited in claim 1, wherein in step a) the response of the gate pin capacitance is obtained from a circuit simulation engine.

4. The method as recited in claim 1, wherein said linear time-invariant filter consists of a resistance and capacitance (RC) network, or a resistance, capacitance, and inductance (RLC) network.

5. The method as recited in claim 1, wherein in step b), curve fitting and error minimization techniques are employed to synthesize the filter from the response.

6. The method as recited in claim 1, wherein a user selects the filter complexity based on a desired accuracy.

7. The method as recited in claim 1, wherein the filter is synthesized once per gate type.

8. The method as recited in claim 1, wherein the synthesized filter is employed during noise or coupling analysis of integrated circuits.

9. The method as recited in claim 1, wherein the synthesized filter is employed during optimization of integrated circuits.

10. The method as recited in claim 1, wherein the modeling is performed during gate library characterization.

11. The method as recited in claim 1, wherein the modeling is performed on-the-fly during timing analysis.

12. The method as recited in claim 4, wherein the filter is synthesized using variational RC or RLC elements with known distributions to model effects of process and environmental source of variations.

13. The method as recited in claim 1, wherein the gate pin capacitance modeling is performed within a statistical timing analysis, noise analysis, or optimization.

14. A program storage device readable by a machine, tangibly embodying a program of instructions executable by the machine to perform method steps for modeling an input slew and output load dependent CMOS gate pin capacitance in a modeled plurality of gates and interconnects representing an integrated circuit, the method steps comprising:
   a) determining a response of the gate pin capacitance to its input slew and output load;
   b) synthesizing a linear time-invariant filter that matches the response;
   c) extending the interconnect model to include the synthesized time-invariant filter; and
   d) inputting said extended interconnect model into a static timing analysis for determining timing behavior between a gate input and each of its fan-out gates.

* * * * *